(12) United States Patent
Miura et al.

(10) Patent No.: US 12,057,101 B2
(45) Date of Patent: Aug. 6, 2024

(54) VEHICLE SOUND GENERATION DEVICE

(71) Applicant: Mazda Motor Corporation, Hiroshima (JP)

(72) Inventors: Yasuhiko Miura, Aki-gun (JP); Keisuke Agusa, Aki-gun (JP)

(73) Assignee: MAZDA MOTOR CORPORATION, Hiroshima (JP)

( * ) Notice: Subject to any disclaimer, the term of this patent is extended or adjusted under 35 U.S.C. 154(b) by 777 days.

(21) Appl. No.: 17/118,615

(22) Filed: Dec. 11, 2020

(65) Prior Publication Data
US 2021/0225356 A1 Jul. 22, 2021

(30) Foreign Application Priority Data

Jan. 21, 2020 (JP) ................. 2020-007341

(51) Int. Cl.
*G10K 15/02* (2006.01)
*H03G 3/30* (2006.01)
(Continued)

(52) U.S. Cl.
CPC ............. *G10K 15/02* (2013.01); *H03G 3/301* (2013.01); *H04R 1/025* (2013.01); *H04R 3/00* (2013.01);
(Continued)

(58) Field of Classification Search
CPC .. G10K 15/02; H03G 3/301; H03G 2201/103; H04R 1/025; H04R 3/00; H04R 2499/13
(Continued)

(56) References Cited

U.S. PATENT DOCUMENTS 7,979,147 B1 * 7/2011 Dunn ..................... G10K 15/02
381/61
8,300,842 B2 * 10/2012 Vaishya ................. G10K 15/02
381/86
(Continued)

FOREIGN PATENT DOCUMENTS

JP 2000-010576 A 1/2000
JP 2004-074994 A 3/2004
(Continued)

OTHER PUBLICATIONS

Office Action issued on May 22, 2023, in corresponding Japanese patent Application No. 2020-007341, 7 pages.

*Primary Examiner* — Richard A Goldman
(74) *Attorney, Agent, or Firm* — XSENSUS LLP

(57) ABSTRACT

A vehicle sound generation device includes a sound control circuit that sets a plurality of frequencies according to a number of motor revolutions and sound pressures to be applied to the plurality of frequencies and generates a synthetic sound signal representing a synthetic sound, and a travel situation estimation circuit that estimates a first travel situation in which the driver accelerates or decelerates a vehicle at a first rate and a second travel situation in which the driver accelerates or decelerates the vehicle at a second rate greater than the first rate, and the sound control circuit changes the magnitudes of the sound pressures to be applied to the plurality of frequencies based on whether the first travel situation, the second travel situation or neither the first travel situation and the second travel situation is estimated.

19 Claims, 6 Drawing Sheets

(51) Int. Cl.
*H04R 1/02* (2006.01)
*H04R 3/00* (2006.01)

(52) U.S. Cl.
CPC ... *H03G 2201/103* (2013.01); *H04R 2499/13* (2013.01)

(58) Field of Classification Search
USPC .......................................................... 701/22
See application file for complete search history.

(56) References Cited

U.S. PATENT DOCUMENTS

| | | | |
|---|---|---|---|
| 10,059,260 B2* | 8/2018 | Kim | G10K 15/02 |
| 11,285,871 B2* | 3/2022 | Kwak | B60Q 9/00 |
| 11,537,358 B1* | 12/2022 | Schmierer | G10H 1/053 |
| 2008/0021632 A1* | 1/2008 | Amano | G08G 1/096827 |
| | | | 701/117 |
| 2008/0060861 A1* | 3/2008 | Baur | B60K 1/00 |
| | | | 180/65.6 |
| 2009/0063000 A1* | 3/2009 | Kodama | B60W 30/16 |
| | | | 701/75 |
| 2010/0166210 A1* | 7/2010 | Isozaki | B60L 3/00 |
| | | | 381/86 |
| 2012/0081222 A1* | 4/2012 | Tamaki | G10K 15/02 |
| | | | 340/466 |
| 2013/0294620 A1* | 11/2013 | Kanehara | H03G 3/20 |
| | | | 381/86 |
| 2014/0375443 A1* | 12/2014 | Aoyagi | B60Q 5/008 |
| | | | 340/425.5 |
| 2016/0068101 A1* | 3/2016 | Holloway | G10K 15/02 |
| | | | 701/36 |
| 2016/0068102 A1* | 3/2016 | Tsuzuki | B60C 5/008 |
| | | | 340/939 |
| 2016/0284334 A1* | 9/2016 | Hera | G10K 15/02 |
| 2017/0072850 A1* | 3/2017 | Curtis | G08G 1/166 |
| 2018/0056860 A1* | 3/2018 | Chang | B60Q 9/00 |
| 2018/0070191 A1* | 3/2018 | Chang | G10K 11/178 |
| 2018/0232196 A1* | 8/2018 | Pietila | G06F 3/16 |
| 2019/0176695 A1* | 6/2019 | Tanaka | B60Q 9/00 |
| 2019/0206384 A1* | 7/2019 | De Cesaris | G10K 15/02 |
| 2019/0385584 A1* | 12/2019 | Han | G10K 11/17823 |
| 2020/0198536 A1* | 6/2020 | Krammer | G10K 15/02 |
| 2021/0221286 A1* | 7/2021 | Miura | H04R 3/00 |
| 2021/0225356 A1* | 7/2021 | Miura | H03G 3/301 |
| 2022/0169174 A1* | 6/2022 | Lee | B60Q 9/00 |
| 2022/0234498 A1* | 7/2022 | Maeda | B60Q 5/008 |
| 2022/0400336 A1* | 12/2022 | Kim | G06F 3/165 |

FOREIGN PATENT DOCUMENTS

| | | |
|---|---|---|
| JP | 2017-62320 A | 3/2017 |
| JP | 2019-070698 A | 5/2019 |
| WO | 2018/158949 A1 | 9/2018 |

* cited by examiner

| | | NUMBER OF MOTOR REVOLUTIONS | | | | | |
|---|---|---|---|---|---|---|---|
| | | 1000rpm | 2000rpm | 3000rpm | 4000rpm | 5000rpm | 6000rpm |
| ORDER | QUATERNARY | 67Hz | 133Hz | 200Hz | 267Hz | 333Hz | 400Hz |
| | SENARY | 100Hz | 200Hz | 300Hz | 400Hz | 500Hz | 600Hz |
| | OCTONARY | 133Hz | 267Hz | 400Hz | 533Hz | 667Hz | 800Hz |

| | | NUMBER OF MOTOR REVOLUTIONS | | | | | |
|---|---|---|---|---|---|---|---|
| | | 1000rpm | 2000rpm | 3000rpm | 4000rpm | 5000rpm | 6000rpm |
| ORDER | QUATERNARY | 44dB | 48dB | 53dB | 60dB | 64dB | 69dB |
| | SENARY | 44dB | 48dB | 52dB | 52dB | 61dB | 64dB |
| | OCTONARY | 44dB | 49dB | 52dB | 53dB | 54dB | 60dB |
| TOTAL SOUND PRESSURE | | 49dB | 53dB | 57dB | 61dB | 66dB | 71dB |

| | | NUMBER OF MOTOR REVOLUTIONS | | | | | |
|---|---|---|---|---|---|---|---|
| | | 1000rpm | 2000rpm | 3000rpm | 4000rpm | 5000rpm | 6000rpm |
| ORDER | QUATERNARY | 44dB | 48dB | 52dB | 52dB | 54dB | 60dB |
| | SENARY | 44dB | 48dB | 52dB | 60dB | 64dB | 64dB |
| | OCTONARY | 44dB | 49dB | 53dB | 53dB | 61dB | 69dB |
| TOTAL SOUND PRESSURE | | 49dB | 53dB | 57dB | 61dB | 66dB | 71dB |

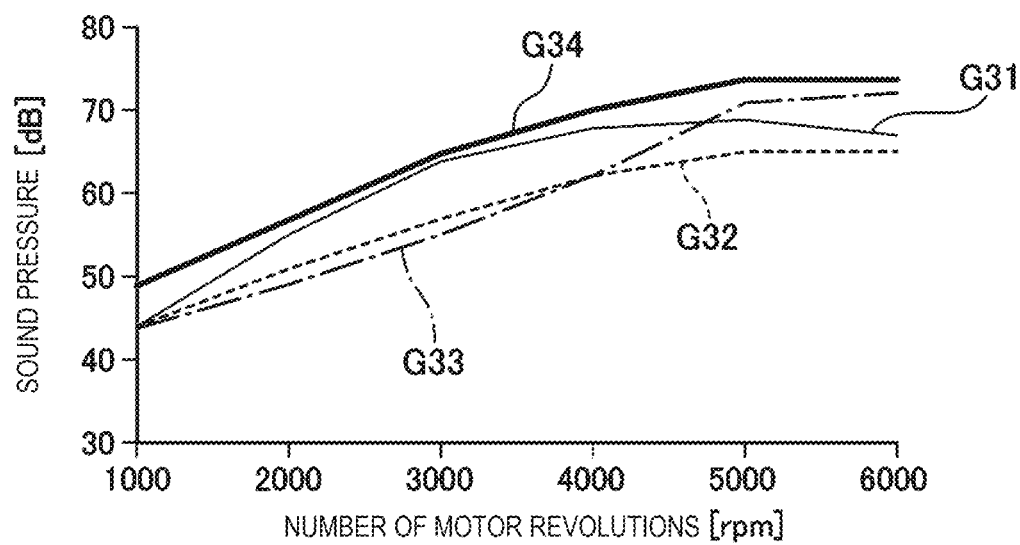

VEHICLE SOUND GENERATION DEVICE

CROSS-REFERENCE TO RELATED APPLICATION

This application claims priority to JP 2020-007341, filed in Japan on Jan. 21, 2020, the contents of which is hereby incorporated by reference.

TECHNICAL FIELD

The present disclosure relates to a vehicle sound generation device and, more particularly, to a vehicle sound generation device that outputs a predetermined sound during a travel of a vehicle.

BACKGROUND ART

A vehicle sound generation device that outputs, to the driver, a sound of a predetermined frequency according to the number of revolutions of the power source of a vehicle has been conventionally developed. For example, there is a technique for generating a sound of a higher frequency as the number of motor revolutions is larger in an electric vehicle (such as an electric motorcycle) driven by an electric motor. In this technique, the rate of changes in the frequency to changes in the number of motor revolutions is set larger in a low speed range than in a high speed range of the number of motor revolutions. Accordingly, the behavior (vehicle speed) of the vehicle is transmitted to the driver by changes in the frequency of the sound provided for the driver.

SUMMARY

The present disclosure describes a vehicle sound generation device mounted in a vehicle that travels with a rotary power source including an electric motor and/or an engine, the vehicle sound generation device including a sound control circuit configured to set a plurality of frequencies according to a number of revolutions of the rotary power source and sound pressures to be applied to the plurality of frequencies, and generate a synthetic sound signal representing a synthetic sound including sounds of the plurality of frequencies to which the set sound pressures have been applied; and a travel situation estimation circuit configured to estimate at least one of a first travel situation in which a driver accelerates or decelerates the vehicle at a first rate and a second travel situation in which the driver accelerates or decelerates the vehicle at a second rate greater than the first rate, wherein the sound control circuit changes magnitudes of the sound pressures to be applied to the plurality of frequencies between a case in which the travel situation estimation circuit estimates the first travel situation or the second travel situation and a case in which the travel situation estimation circuit estimates neither the first travel situation nor the second travel situation.

BRIEF DESCRIPTION OF THE DRAWINGS

FIG. 6A is a graph of a third sound pressure map according to the embodiment of the present disclosure.

FIG. 6B is a table of the third sound pressure map according to the embodiment of the present disclosure.

DETAILED DESCRIPTION OF THE DRAWINGS

In accordance with the present disclosure, a vehicle sound generation device preferably outputs a sound so that a driver can perform an appropriate accelerator operation according to a travel situation of a vehicle. Specifically, the driver preferably grasps the operational state of a vehicle and the state of the power source based on the sound output from the vehicle sound generation device, so that the driver can perform a correct accelerator operation suitable for the travel situation (for example, accelerates or decelerates) of the vehicle.

A vehicle sound generation device according to an embodiment of the present disclosure will be described with reference to the accompanying drawings.

<Structure of Vehicle Sound Generation Device>

Figure 1:
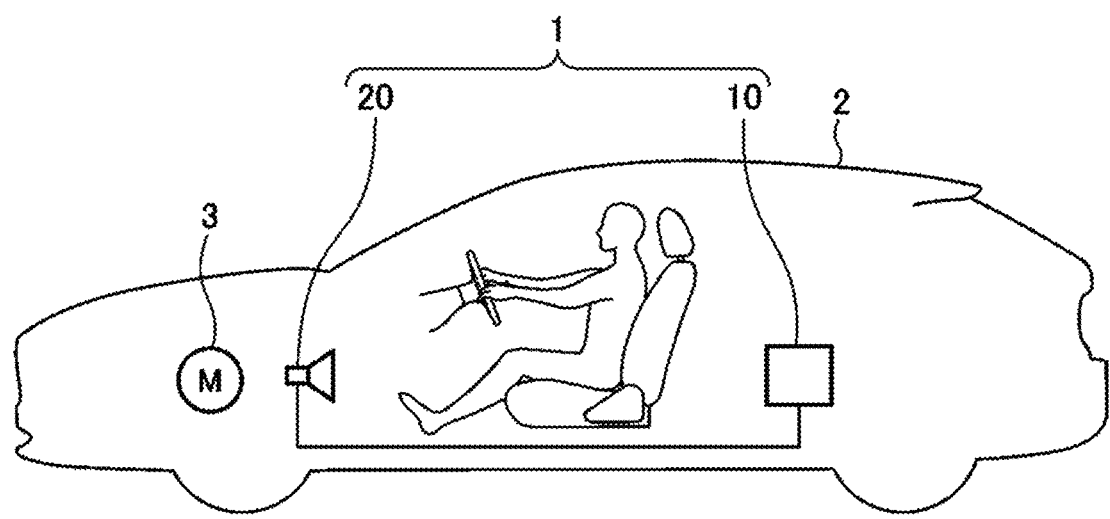
FIG. 1 is an explanatory diagram illustrating a vehicle sound generation device according to an embodiment of the present disclosure.

First, the structure of the vehicle sound generation device according to the embodiment of the present disclosure will be described with reference to FIGS. 1 and 2. FIG. 1 is an explanatory diagram illustrating the vehicle sound generation device according to the embodiment of the present disclosure and FIG. 2 is a structural diagram illustrating the vehicle sound generation device according to the embodiment of the present disclosure.

Figure 2:
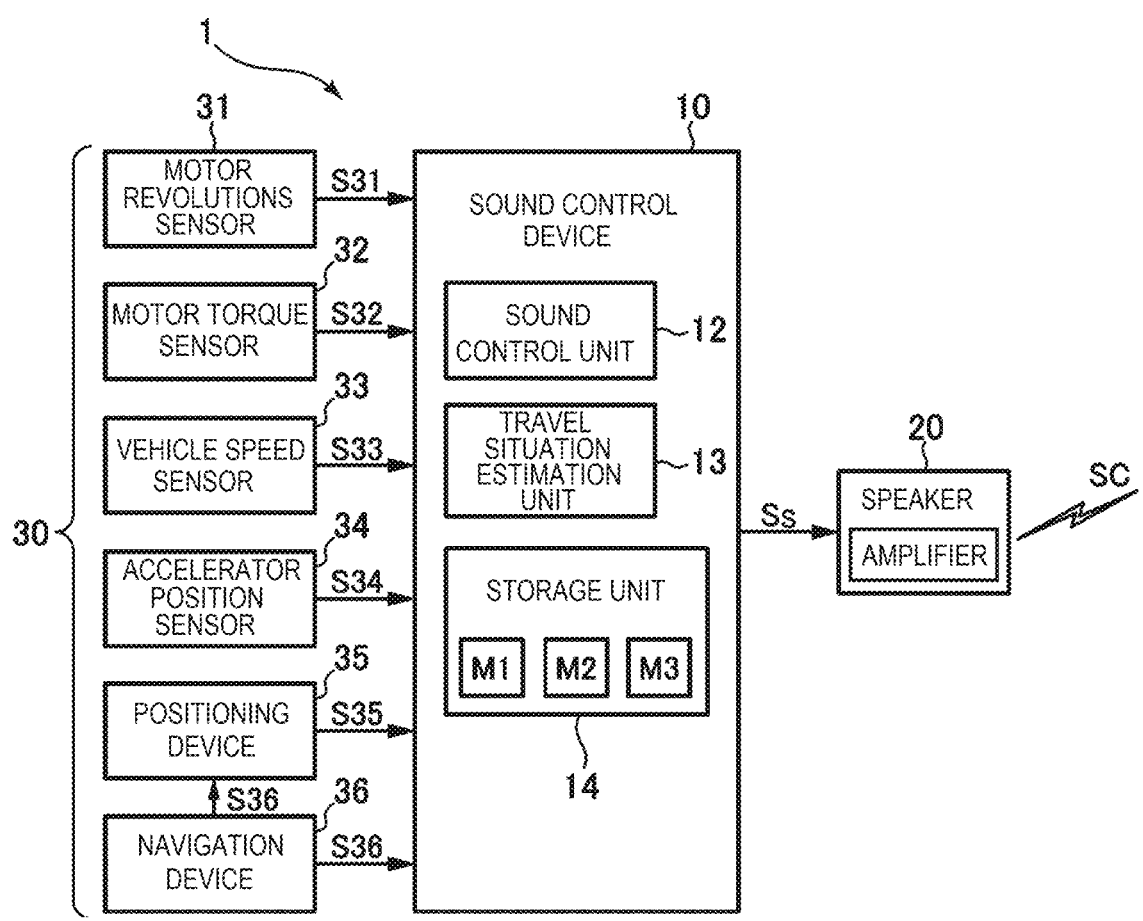
FIG. 2 is a structural diagram illustrating the vehicle sound generation device according to the embodiment of the present disclosure.

As illustrated in FIGS. 1 and 2, a vehicle sound generation device 1 according to the embodiment includes a sound control device 10 that is mounted in a vehicle 2, a speaker 20 that outputs a predetermined sound to a driver in a vehicle interior, and a sensor group 30 of various sensors that detect various types of information.

The vehicle 2 is an electric vehicle (EV) having an electric motor 3 as a rotary power source. Since the vehicle 2 does not have an internal combustion engine (such as a gasoline engine or a diesel engine), so-called engine noise is not generated during a travel. The electric motor 3 generates operating noise, but the operating noise of a motor is smaller than the noise of an engine. Therefore, the driver in the vehicle can hardly recognize the operating noise of the motor. In the embodiment, the vehicle sound generation device 1 generates the sound according to the operation situation of the electric motor 3 so that the driver can grasp the operation situation of the power train of the vehicle 2 including the electric motor 3.

The sound control device 10 includes a circuit and is a controller that includes one or more processors as central processing units (CPU) that execute programs, a memory (storage unit 14) that includes, for example, a RAM (random access memory) and a ROM (read only memory) and stores various programs and databases, a data input/output device for inputting and outputting electric signals, and the like. Moreover, the functionality of the sound control device 10, to be discussed below, may be implemented using circuitry or processing circuitry which includes general purpose processors, special purpose processors, integrated circuits, ASICS ("Application Specific Integrated Circuits"), conventional circuitry, controllers, and/or combinations thereof which are configured or programmed to perform the disclosed functionality. Processors and controllers are considered processing circuitry or circuitry as they include transistors and other circuitry therein. In this disclosure, any circuitry, units, controllers, or means are hardware carry out or are programmed to perform the recited functionality. The hardware may be any hardware disclosed herein or otherwise known which is programmed or configured to carry out the recited functionality. When the hardware is a processor or controller which may be considered a type of circuitry, the circuitry, means, or units are a combination of hardware and processing instructions that configure the hardware and/or processor. In the following, the sound control device 10 may also be referred to as sound control circuit 10, sound control circuitry 10 and/or processing circuitry.

The databases in the storage unit 14 store first, second, and third sound pressure maps M1, M2, and M3 and the like. The sound control device 10 is communicably connected to other in-vehicle devices via an in-vehicle communication line. The sound control device 10 outputs a sound signal Ss including sound information (such as the frequency and the sound pressure) to the speaker 20 by causing the processors to execute programs based on various types of information from the sensor group 30. In some implementations, the processors/circuitry of the sound control device 10 function as the sound control unit 12 and the travel situation estimation unit 13 as described later. In other implementations, the sound control unit 12 and/or the travel situation estimation unit 13 comprise separate processors/circuitry form that of the sound control device 10.

The speaker 20 is a sound output unit having an amplifier. The speaker 20 receives the sound signal Ss from the sound control device 10, amplifies the sound signal Ss with a predetermined amplification factor, and outputs a synthetic sound SC based on the sound signal Ss. It should be noted here that the speaker 20 does not need to be provided in the vehicle interior as long as the driver can recognize the synthetic sound SC generated by the speaker 20.

The sensor group 30 includes a motor revolutions sensor 31 that detects the number of motor revolutions of the electric motor 3, a motor torque sensor 32 that detects the motor torque of the electric motor 3, a vehicle speed sensor 33 that detects the vehicle speed of the vehicle 2, and an accelerator position sensor 34 that detects the accelerator opening corresponding to the operation amount of the accelerator pedal of the vehicle 2. These sensors 31, 32, 33, and 34 transmit signals S31, S32, S33, and S34 corresponding to the detected information to the sound control device 10 through the in-vehicle communication line. The motor torque does not need to be detected by the motor torque sensor 32 and the motor torque (corresponding to the requested motor torque) may be calculated based on the accelerator opening or the like by an ECU in the vehicle 2 in another example.

Furthermore, the sensor group 30 includes a positioning device 35 and a navigation device 36. The positioning device 35 includes a GPS receiver, a gyro sensor, and the like, obtains the position (current position) of the vehicle 2, and transmits a signal S35 corresponding to this position of the vehicle 2 to the sound control device 10 through the in-vehicle communication line. The navigation device 36 internally stores map information and transmits a signal S36 corresponding to this map information to the sound control device 10 through the in-vehicle communication line. In addition, the navigation device 36 also transmits the signal S36 corresponding to the map information to the positioning device 35. The map information includes road information and the like, and this road information includes the road type (such as a high-speed road, a general road, or a winding road), interchange (IC) information, and junction (JCT) information, the altitude of a road, the curvature of a road, and the like.

For example, the positioning device 35 calculates the x-, y-, and z-coordinates of the vehicle 2 using at least one of the global navigation satellite system (GNSS), dead-reckoning navigation, and road-to-vehicle communication using Wi-Fi and the like. In addition, the positioning device 35 may calculate the position on the map of the vehicle 2 by map matching based on the map information obtained from the navigation device 36. The map information stored in the navigation device 36 does not need to be used and may use the map information stored in the sound control device 10 in another example. In still another example, the map information stored in a predetermined server device may be obtained from this server device.

In the embodiment, the sound control unit 12 of the sound control device 10 sets a plurality of frequencies according to the number of revolutions of the motor and the sound pressures to be applied to the plurality of frequencies and generates the synthetic sound signal Ss representing a synthetic sound including sounds of the plurality of frequencies to which the set sound pressures have been applied. In addition, the travel situation estimation unit 13 of the sound control device 10 estimates the first travel situation in which the driver accelerates or decelerates the vehicle 2 gently and the second travel situation in which the driver accelerates or decelerates the vehicle 2 more quickly than in the first travel situation based on at least one of the position of the vehicle 2 obtained by the positioning device 35, the map information (particularly, the road information) obtained by the navigation device 36, and the accelerator opening detected by the accelerator position sensor 34.

In particular, in the embodiment, the sound control unit 12 changes the magnitudes of the sound pressures to be applied to the plurality of frequencies based on the travel situation estimated by the travel situation estimation unit 13 as described above. Specifically, the sound control unit 12 changes the magnitudes of the sound pressures to be applied to the plurality of frequencies between the case in which the travel situation estimation unit 13 estimates the first travel situation or the second travel situation and the case in which the travel situation estimation unit 13 estimates neither the first travel situation nor the second travel situation (the travel situation in this case corresponds to the travel situation of a travel at a substantially constant speed and is referred to below as the "constant travel situation"). More specifically, the sound control unit 12 sets the sound pressure using the first sound pressure map M1 when the constant travel situation is estimated, sets the sound pressure using the second sound pressure map M2 when the first travel situation is estimated, and sets the sound pressure using the third sound pressure map M3 when the second travel situation is estimated among the first, second, and third sound pressure maps M1, M2, and M3 (created and stored in advance) stored in the storage unit 14.

<Travel Situations>

Next, the travel situations used in the embodiment of the present disclosure will be specifically described.

The first travel situation is the travel situation in which the vehicle 2 accelerates or decelerates gently. Specifically, the first travel situation corresponds to the travel situation in which the driver needs to perform a correct accelerator operation so as to minimize the jolt (jerk) caused in the vehicle 2 when the vehicle 2 travels on a road in which the curvature and the altitude thereof change. For example, the first travel situation includes the situation in which the vehicle 2 travels on a winding road or the situation in which the vehicle speed needs to be kept constant on a road with many ups and downs. In the first travel situation described above, an accelerator operation of, for example, approximately 20% to 50% is performed. That is, the change amount of the accelerator opening per a predetermined time is approximately 20% to 50%. In this example, the driver performs an accelerator operation of approximately 20% to 50% in less than one second to obtain a small torque in a short time and performs an accelerator operation of approximately 20% to 50% in one second or more to change the torque gently in several seconds to several tens of seconds.

The second travel situation is the travel situation in which vehicle 2 accelerates or decelerates quickly. Specifically, the second travel situation corresponds to the travel situation n which the vehicle 2 is largely accelerated or decelerated. For example, the second travel situation includes the situation in which the vehicle 2 merges into the main road or the situation in which the vehicle 2 leaves the main road at an interchange or a junction of an expressway. In the second travel situation described above, for example, an accelerator operation of 50% or more is performed. That is, the change amount of the accelerator opening per a predetermined time is 50% or more. In this example, the driver performs an accelerator operation of 50% or more in less than one second to obtain a large torque in a short time, performs an accelerator operation of approximately 50% or more in one to three seconds to largely change the torque in several seconds, and performs an accelerator operation of approximately 50% or more in three or more seconds to obtain a large torque in several tens of seconds.

The constant travel situation is the travel situation in which the driver causes the vehicle 2 to travel at a substantially constant speed. For example, in the constant travel situation, the change amount of the accelerator opening per a predetermined time is less than 20%. In this example, the driver performs a slight accelerator operation of less than 20% in less than one second, or performs an accelerator operation of less than 20% in one or more second to cause the vehicle to travel at a constant vehicle speed (that is, to perform so-called road-load adjustment) regardless of the travel resistance.

<Sound Generation Processing>

Figures 3, 4A, 4B:
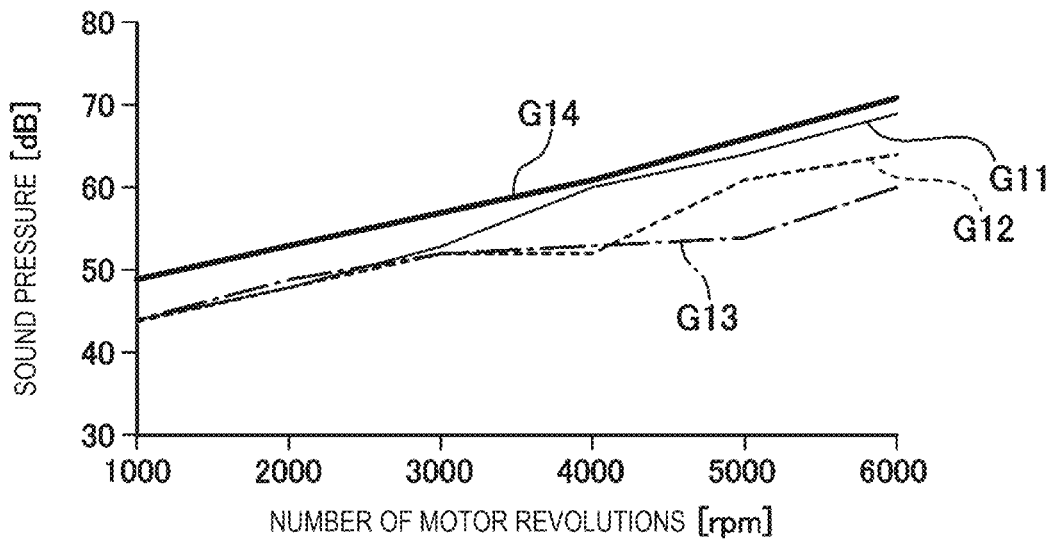
FIG. 3 is a table of a frequency map according to the embodiment of the present disclosure.
FIG. 4A is a graph of a first sound pressure map according to the embodiment of the present disclosure.
FIG. 4B is a table of the first sound pressure map according to the embodiment of the present disclosure.
Figures 5A, 5B:
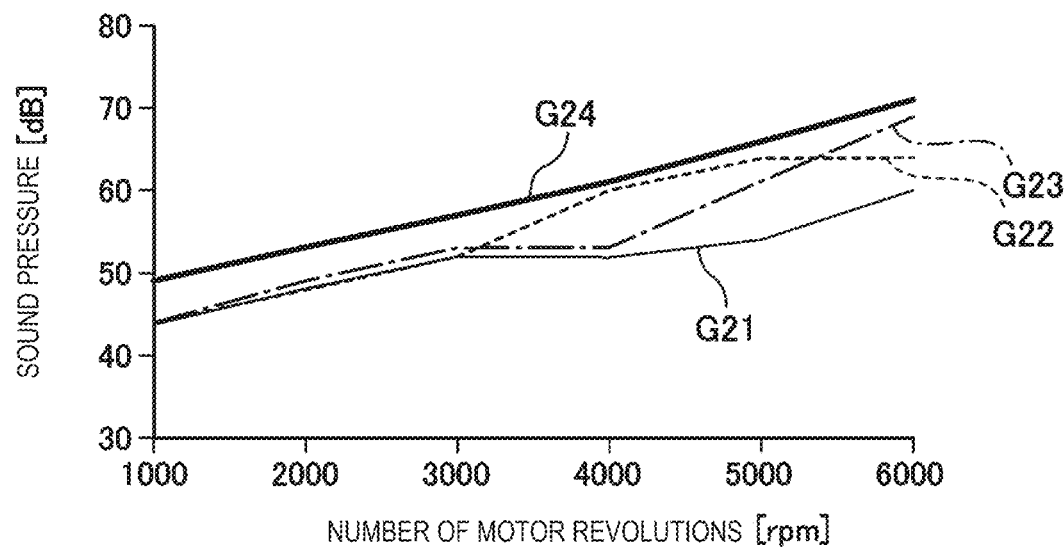
FIG. 5A is a graph of a second sound pressure map according to the embodiment of the present disclosure.
FIG. 5B is a table of the second sound pressure map according to the embodiment of the present disclosure.

Next, the sound generation processing by the vehicle sound generation device 1 according to the embodiment of the present disclosure will be described with reference to FIGS. 3 to 6. FIG. 3 illustrates the frequency map according to the embodiment of the present disclosure, FIGS. 4A and 4B illustrate the first sound pressure map M1 according to the embodiment of the present disclosure, FIGS. 5A and 5B show the second sound pressure map M2 according to the embodiment of the present disclosure, and FIGS. 6A and 6B illustrate the third sound pressure map M3 according to the embodiment of the present disclosure.

In the sound generation processing, first, the sound control unit 12 of the sound control device 10 sets a plurality of frequencies according to the number of motor revolutions with reference to the frequency map in the FIG. 3. The sound control unit 12 generates a plurality of sinusoidal waves of the n-order frequency using the number of motor revolutions as the primary frequency (reference frequency). In the embodiment, examples of setting three frequencies (quaternary, senary, and octonary frequencies), that is, the quaternary frequency, the senary frequency, and the octonary frequency are given (this means that the synthetic sound SC in which the sounds of the quaternary frequency, the senary frequency, and the octonary frequency are synthesized is generated in the processing described later). It should be noted here that the three frequencies (quaternary, senary, and octonary frequencies) do not need to be used, frequencies of different orders may be used, or less than three or four or more frequencies may be used (this is also true in the following examples).

In the frequency map in FIG. 3, the frequencies to be set according to the number of motor revolutions are defined for the quaternary order, senary order, and octonary order. In this frequency map, with respect to the same number of motor revolutions, the higher the order, the higher the frequency to be set. Also, with respect to the same order, the higher the numbers of motor revolutions, the higher the frequency to be set. The sound control unit 12 sets the quaternary, senary, and octonary frequencies according to the current number of motor revolutions obtained by the motor revolutions sensor 31 with reference to such a frequency map. For example, when the current number of motor revolutions is 3000 rpm, the sound control unit 12 sets the quaternary frequency, the senary frequency, and the octonary frequency to 200 Hz, 300 Hz, and 400 Hz, respectively. Although only the frequencies corresponding to the six numbers of motor revolutions are illustrated for each order in FIG. 3, the frequency map actually defines the frequencies to be set for the more numbers of (innumerable) motor revolutions.

Next, in the sound generation processing, the sound control unit 12 of the sound control device 10 sets the sound pressures to be applied to sounds of the quaternary frequency, the senary frequency, and the octonary frequency and generates the synthetic sound signal Ss representing a synthetic sound including the sounds of the quaternary frequency, the senary frequency, and the octonary frequency to which the sound pressures set in this way have been applied. Basically, the sound control unit 12 sets the sound pressure according to the number of motor revolutions as in the frequency. In particular, in the embodiment, the sound control unit 12 sets the sound pressures using the first, second, or third sound pressure map M1, M2, or M3 that depends on the travel situation (one of the constant travel situation, the first travel situation, and the second travel situation) estimated by the travel situation estimation unit 13 of the sound control device 10. More specifically, the sound control unit 12 sets the sound pressure using the first sound pressure map M1 when the constant travel situation is estimated, sets the sound pressure using the second sound pressure map M2 when the first travel situation is estimated, and sets the sound pressure using the third sound pressure map M3 when the second travel situation is estimated.

First, the first sound pressure map M1 applied in the constant travel situation will be described with reference to FIGS. 4A and 4B. FIG. 4A illustrates the first sound pressure map M1 represented by a graph and FIG. 4B illustrates the first sound pressure map M1 represented by a table. In FIG. 4A, lines G11, G12, and G13 represent the sound pressures to be set for the sounds of the quaternary frequency, the senary frequency, and the octonary frequency, respectively, and line G14 represents the total value (total sound pressure) of the sound pressures for the quaternary frequency, the senary frequency, and the octonary frequency, that is, the sound pressure of the synthetic sound SC.

As illustrated in FIGS. 4A and 4B, the first sound pressure map M1 defines the sound pressures to be set for the sounds of the quaternary frequency, the senary frequency, and the octonary frequency according to the number of motor revolutions. Basically, for all the sounds of the quaternary frequency, the senary frequency, and the octonary frequency, the higher the number of motor revolutions, the higher the sound pressure to be set. Accordingly, as a matter of course, the higher the number of motor revolutions, the higher the total sound pressure. Particularly, in the first sound pressure map M1, the higher the number of motor revolutions, the larger the ratio of the sound pressure in the low frequency band (quaternary frequency) to the total sound pressure.

Next, the second sound pressure map M2 to be applied in the first travel situation (travel situation in which the vehicle 2 accelerates or decelerates gently) will be described with reference to FIGS. 5A and 5B. FIG. 5A illustrates the second sound pressure map M2 represented by a graph and FIG. 5B illustrates the second sound pressure map M2 represented by a table. In FIG. 5A, lines G21, G22, and G23 represent the sound pressures to be set for the sounds of the quaternary frequency, the senary frequency, and the octonary frequency, respectively, and line G24 represents the total value (total sound pressure) of the sound pressures for the quaternary frequency, the senary frequency, and the octonary frequency.

Here, only the characteristics of the second sound pressure map M2 that are different from those of the first sound pressure map M1 will be described and the same characteristics are not described. As represented in FIGS. 5A and 5B, with respect to the same the number of motor revolutions, the ratio of the sound pressure in the high frequency band (senary or octonary frequency) to the total sound pressure in the second sound pressure map M2 is larger than that in the first sound pressure map M1 (see FIGS. 4A and 4B). This tendency is particularly noticeable in a relatively high revolutions band. Here, human auditory perception is highly sensitive to a sound at a relatively high frequency (from the equal loudness curve or the like). Accordingly, when the ratio of the sound pressure in the high frequency band to the total sound pressure is large as described above, the driver easily recognizes a slight change in the state (such as the number of revolutions) of the electric motor 3 and the operational state (such as the vehicle speed) of the vehicle 2 through a change in the pitch of a sound from the vehicle sound generation device 1, consequently enabling a delicate accelerator operation.

In the second sound pressure map M2, even when the ratio of the sound pressure in the high frequency band to the total sound pressure is larger than that of the first sound pressure map M1, the magnitude of the total sound pressure is the same as in the first sound pressure map M1 (see FIGS. 4A-5B). That is, with respect to the same number of motor revolutions, the total sound pressure is the same between the first sound pressure map M1 and the second sound pressure map M2. This suppresses the harshness due to a high frequency sound (high-pitched sound) when the second sound pressure map M2 is applied and suppresses the occurrence of the discomfort due to changes in total sound pressure when the map to be applied is switched between the first sound pressure map M1 and the second sound pressure map M2.

Next, the third sound pressure map M3 to be applied in the second travel situation (travel situation in which the vehicle 2 accelerates or decelerates quickly) will be described with reference to FIGS. 6A and 6B. FIG. 6A represents the third sound pressure map M3 represented by a graph and FIG. 6B illustrates the third sound pressure map M3 represented by a table. In FIG. 6A, lines G31, G32, and G33 represent the sound pressures to be set for the sounds of the quaternary frequency, the senary frequency, and the octonary frequency, respectively, and line G34 represents the total value (total sound pressure) of the sound pressures for the quaternary frequency, the senary frequency, and the octonary frequency.

Here, only the characteristics of the third sound pressure map M3 that are different from those of the first sound pressure map M1 will be described and the same characteristics are not described. In the third sound pressure map M3 represented in FIGS. 6A and 6B, the sound pressure according to the number of motor revolutions is defined so as to match the torque curve (the characteristics of the motor torque with respect to the number of motor revolutions of the electric motor 3) of the electric motor 3. In addition, in the third sound pressure map M3, the total sound pressure with respect to the same number of motor revolutions is higher than in the first sound pressure map M1 (see FIGS. 4A and 4B). This causes the driver to feel the strength of acceleration as the sound pressure. The increase in the total sound pressure in the third sound pressure map M3 described above ends at the number of motor revolutions corresponding to the peak of the torque curve, that is, the total sound pressure is substantially constant in the region equal to or more than the number of motor revolutions corresponding to the peak.

In addition, in the low revolutions range in which the number of motor revolutions is less than a predetermined value, when the third sound pressure map M3 is compared with the first sound pressure map M1, the ratio of the sound pressure in the low frequency band (quaternary frequency) to the total sound pressure is larger (see FIGS. 4A-4B and 6A-6B) with respect to the same number of motor revolutions. This causes the driver to feel the strength of acceleration as the low frequency sound (low-pitched sound). In contrast, in the high revolutions range in which the number of motor revolutions is equal to or more than the predetermined value (for example, close to the number of motor revolutions corresponding to the peak of the torque curve), when the third sound pressure map M3 is compared with the first sound pressure map M1, the ratio of the sound pressure in the high frequency band (octonary frequency) to the total sound pressure is larger (see FIGS. 4A-4B and 6A-6B) with respect to the same number of motor revolutions. This increases the harshness due to a high frequency sound (high-pitched sound) and prompts the driver, for example, to make a shift change. Here, in the region equal to or more than the number of motor revolutions corresponding to the peak of the torque curve in the third sound pressure map M3, the ratio of the sound pressure in the high frequency band to the total sound pressure may be increased or the ratio of the sound pressure in the high frequency band to the total sound pressure may be substantially constant.

In another example, the first, second, and third sound pressure maps M1, M2, and M3 may be divided into different maps for each order. For example, the first sound pressure map M1 may be divided into separate maps that define the sound pressures for the quaternary frequency, the senary frequency, and the octonary frequency.

Figure 7:
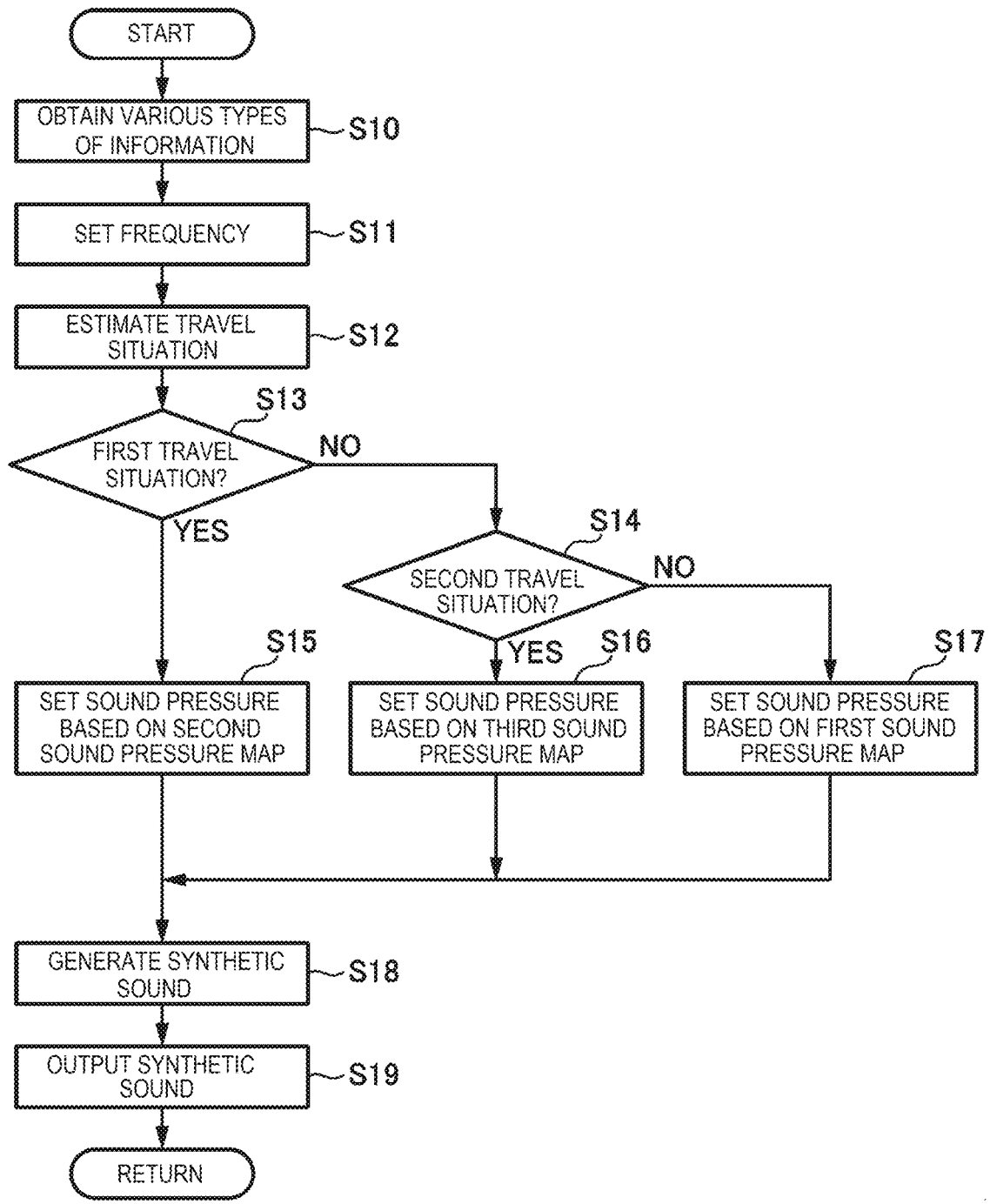
FIG. 7 is a flowchart illustrating sound generation processing according to the embodiment of the present disclosure.

Next, the flow of sound generation processing according to the embodiment of the present disclosure will be described with reference to FIG. 7. FIG. 7 is a flowchart illustrating the sound generation processing according to the embodiment of the present disclosure. This sound generation processing is repeatedly executed by the vehicle sound generation device 1 (mainly the sound control device 10 and the speaker 20) in a predetermined cycle.

First, in step S10, the sound control device 10 obtains various types of information from the sensor group 30. Specifically, the sound control device 10 obtains the number of motor revolutions detected by the motor revolutions sensor 31, the motor torque detected by the motor torque sensor 32, the vehicle speed detected by the vehicle speed sensor 33, the accelerator opening detected by the accelerator position sensor 34, the position of the vehicle 2 calculated by the positioning device 35, and the map information stored in the navigation device 36.

Next, S11, the sound control device 10 (specifically, the sound control unit 12) generates the sinusoidal waves of the quaternary, senary, and octonary frequencies using the number of motor revolutions as the primary frequency (reference frequency). Specifically, the sound control unit 12 sets the frequency corresponding to the current number of motor revolutions obtained in step S10 for the sinusoidal waves of the quaternary, senary, and octonary frequencies with reference to the frequency map stored in the storage unit 14 of the sound control device 10 (FIG. 3).

Next, in step S12, the sound control device 10 (specifically, the travel situation estimation unit 13) estimates the travel situation of the vehicle 2 based on at least one of the position of the vehicle 2 (the x-, y-, and z-coordinates and the position on the map), the map information (particularly, the road information), and the accelerator opening obtained in step S10. Specifically, the travel situation estimation unit 13 estimates the constant travel situation, the first travel situation, and the second travel situation by the methods described below. The methods described below may be combined as appropriate.

In one example, the travel situation estimation unit 13 estimates the travel situation of the vehicle 2 based on changes in the position of the vehicle 2. In this example, when the track of changes in the position of the vehicle 2 is far from a straight line, the travel situation estimation unit 13 determines that the vehicle 2 is traveling on a winding road, and estimates that the travel situation of the vehicle 2 is the first travel situation. In addition, the travel situation estimation unit 13 determines that the vehicle 2 is traveling on a road with many ups and downs when the height position (z-coordinate described above) of the vehicle 2 changes frequently, and estimates that the travel situation of the vehicle 2 is the first travel situation.

In another example, the travel situation estimation unit 13 estimates the travel situation of the vehicle 2 based on road information around the vehicle 2. In this example, the travel situation estimation unit 13 estimates that the travel situation of the vehicle 2 is the first travel situation when the road type included in the road information around the vehicle 2 represents a winding road. In addition, the travel situation estimation unit 13 determines that the vehicle 2 is traveling on a road that repeatedly moves up and down or left and right when the altitude or curvature of the road included in the road information around the vehicle 2 changes frequently, and estimates that the travel situation of the vehicle 2 is the first travel situation. In addition, the travel situation estimation unit 13 determines that the vehicle 2 merges into or separates from the main road of an expressway when the road information around the vehicle 2 includes information of an interchange or a junction (or when the road type represents an interchange or a junction), and estimates that the travel situation of the vehicle 2 is the second travel situation.

In still another example, the travel situation estimation unit 13 estimates the travel situation of the vehicle 2 based on changes in the accelerator opening. In this example, the travel situation estimation unit 13 estimates that the travel situation of the vehicle 2 is the constant travel situation when the change amount of the accelerator opening per a predetermined time is less than 20%, estimates that the travel situation of the vehicle 2 is the first travel situation when the change amount of the accelerator opening per the predetermined time is approximately 20% to 50%, and estimates that the travel situation of the vehicle 2 is the second travel situation when the change amount of the accelerator opening per the predetermined time is equal to or more than 50%.

In the above example, the accelerator opening is defined by percentage. This accelerator opening is defined by assuming that full close is 0% full open is 100%. In another example, the accelerator opening defined by an angle may be used. In still another example, the accelerator opening defined by a length may be used. In this case, the moving distance in the distal end portion of the accelerator pedal may be used.

Next, in step S13, the sound control device 10 (specifically, the sound control unit 12) determines whether the first travel situation has been estimated in step S12. As a result, when the first travel situation has been estimated (Yes in step S13), the sound control unit 12 proceeds to step S15. In step S15, the sound control unit 12 sets the sound pressures to be applied to the quaternary frequency, the senary frequency, and the octonary frequency set in step S11 according to the current number of motor revolutions with reference to the second sound pressure map M2 for the first travel situation stored in the storage unit 14 of the sound control device 10 (FIGS. 5A and 5B).

In contrast, when the first travel situation is not estimated (No in step S13), the sound control unit 12 proceeds to step S14 and determines whether the second travel situation has been estimated in step S12. As a result, when the second travel situation has been estimated (Yes in step S14), the sound control unit 12 proceeds to step S16. In step S16, the sound control unit 12 sets the sound pressures to be applied to the quaternary frequency, the senary frequency, and the octonary frequency set in step S11 according to the current number of motor revolutions with reference to the third sound pressure map M3 for the second travel situation stored in the storage unit 14 of the sound control device 10 (FIGS. 6A and 6B).

In contrast, when the second travel situation has not been estimated (No in step S14), the sound control unit 12 proceeds to step S17. This case corresponds to the case in which the travel situation of the vehicle 2 is the constant travel situation. In step S17, the sound control unit 12 sets the sound pressures to be applied to the quaternary frequency, the senary frequency, and the octonary frequency set in step S11 according to the current number of motor revolutions with reference to the first sound pressure map M1 for the constant travel situation stored in the storage unit 14 of the sound control device 10 (FIGS. 4A and 4B).

Next, after the sound pressures for the frequencies are set in steps S15, S16, and S17 above, the sound control device 10 (specifically, the sound control unit 12) generates the synthetic sound signal Ss representing the sound SC having the set sound pressures and outputs the synthetic sound signal Ss to the speaker 20 in step S18. Next, in step S19, the speaker 20 receives the synthetic sound signal Ss and outputs the synthetic sound SC.

In steps S15, S16, and S17, the sound control unit 12 may set the sound pressures to be applied to the sounds of the quaternary frequency, the senary frequency, and the octonary frequency by further considering the motor torque obtained in step S10. Specifically, the sound control unit 12 may correct the sound pressure set according to the number of motor revolutions based on one of the first, second, and third sound pressure maps M1, M2, and M3 as described above so that the sound pressure becomes higher as the motor torque is larger.

In addition, the travel situation estimation unit 13 can estimate the travel situation of the vehicle 2 by a method other than those illustrated above. In one example, the travel situation estimation unit 13 may determine that the vehicle 2 accelerates to overtake the preceding vehicle when the accelerator opening is equal to or more than a predetermined value and the winker (direction indicator) lights, and estimate that the travel situation of the vehicle 2 is the second travel situation. In still another example, the travel situation estimation unit 13 may determine that the driver operates the vehicle 2 at low power consumption when the SOC (State of Charge) of the battery that supplies electric power for driving the electric motor 3 is less than a predetermined value or when the remaining travel distance (allowable travel distance) of the vehicle 2 according to the SOC of the battery is less than a predetermined value (for example, 50 km), and may estimate that the travel situation of the vehicle 2 is the first travel situation. The remaining travel distance only needs to be calculated based on the SOC of the battery and the electricity consumption information of the vehicle 2.

Operation and Effect

Next, the operation and effect of the vehicle sound generation device 1 according to the embodiment of the present disclosure will be described.

In the vehicle sound generation device 1 according to the embodiment, the travel situation estimation unit 13 of the sound control device 10 estimates the first travel situation in which the driver accelerates or decelerates the vehicle 2 gently and the second travel situation in which the driver accelerates or decelerates the vehicle 2 more quickly than in the first travel situation and the sound control unit 12 of the sound control device 10 changes the magnitudes of the sound pressures to be applied to a plurality of frequencies that form a synthetic sound between the case in which the first or second travel situation is estimated and the case in which neither the first travel situation nor the second travel situation is estimated (that is, when the constant travel situation is estimated). This enables the driver to hear sounds useful for perception depending on the travel situation. As a result, the driver grasps the state (such as the number of revolutions) of the electric motor 3 and the operational state (such as the vehicle speed) of the vehicle 2 based on the sound output from the vehicle sound generation device 1 and can perform a correct accelerator operation suitable for the travel situation of the vehicle 2.

In addition, in the embodiment, the sound control unit 12 of the sound control device 10 makes the ratio of the sound pressure of the sound in the high frequency band to the total sound pressure in the case in which the first travel situation is estimated larger than in the case in which the constant travel situation is estimated. This enables the driver to hear a high frequency sound to which human auditory perception is highly sensitive in the first travel situation. As a result, the driver easily recognizes a slight change in the state of the electric motor 3 and the operational state of the vehicle 2 through a change in the pitch of a sound from the vehicle sound generation device 1, thereby enabling a delicate accelerator operation.

In addition, in the embodiment, the sound control unit 12 of the sound control device 10 makes the total sound pressure identical between the case in which the first travel situation is estimated and the case in which the constant travel situation is estimated. This can suppress the harshness due to a high frequency sound in the first travel situation and the discomfort caused by a change in the sound pressure when the first travel situation is switched to the constant travel situation.

In addition, in the embodiment, the sound control unit 12 of the sound control device 10 makes the total sound pressure in the case in which the second travel situation is estimated higher than in the case in which the constant travel situation is estimated. This can cause the driver to feel the strength of acceleration through the sound pressure in the second travel situation.

In addition, in the embodiment, when the second travel situation is estimated in the low revolutions range in which the number of motor revolutions is less than the predetermined value, the sound control unit 12 of the sound control device 10 makes the ratio of the sound pressure of the sound in the low frequency band to the total sound pressure larger than in the case in which the constant travel situation is estimated. This can cause the driver to feel the strength of acceleration through a low frequency sound in the low revolutions range in the second travel situation.

In addition, in the embodiment, when the second travel situation is estimated in the high revolutions range in which the number of motor revolutions is equal to or more than the predetermined value, the sound control unit 12 of the sound control device 10 makes the ratio of the sound pressure of the sound in the high frequency band to the total sound pressure larger than in the case in which the constant travel situation is estimated. This can prompt, for example, a shift change by the driver by increasing the harshness due to a high frequency sound in the high revolutions range in the second travel situation.

In addition, in the embodiment, the travel situation estimation unit 13 of the sound control device 10 estimates the first travel situation and the second travel situation based on changes in the position of the vehicle 2. Accordingly, the travel situation according to the geometry of the travel road can be estimated by determining the geometry of the travel road based on changes in the position of the vehicle 2.

In addition, in the embodiment, the travel situation estimation unit 13 of the sound control device 10 estimates the first travel situation and the second travel situation based on the road information around the vehicle 2. This can estimate the travel situation according to the geometry of the travel road by determining the geometry of the travel road based on various types of information (such as, for example, the road type, and the altitude and curvature of the road) included in the road information.

In addition, in the embodiment, the travel situation estimation unit 13 of the sound control device 10 estimates the first travel situation and the second travel situation based on changes in the accelerator opening. This can estimate the travel situation according to the accelerator operation by the driver.

Modification

Although the sound pressure map to be applied is automatically switched according to the travel situation estimated by the travel situation estimation unit 13 of the sound control device 10 in the above embodiment, the sound pressure map to be applied may be manually switched by a switch operation by the driver in another example. In still another example, the sound pressure map to be applied may be switched by a voice instruction by the driver.

Although the travel situation estimation unit 13 of the sound control device 10 estimates both the first travel situation and the second travel situation in the above embodiment, the travel situation estimation unit 13 may estimate only one of the first travel situation and the second travel situation in another example. In this example, the sound control unit 12 of the sound control device 10 only needs to use only one of the second sound pressure map M2 for the first travel situation and the third sound pressure map M3 for the second travel situation.

Although the vehicle 2 is an electric vehicle (EV) and does not have an internal combustion engine in the embodiment described above, the vehicle 2 may have one or both of an internal combustion engine and an electric motor as the rotary power source in another example. In a modification in which the vehicle 2 has only an internal combustion engine, the driver can grasp the vehicle state and changes in the vehicle state more clearly via the sound generated by vehicle sound generation device 1 in addition to the operating sound of the engine. In addition, in this modification, the number of revolutions of the internal combustion engine (the number of engine revolutions) can be used to determine the frequency and the sound pressure of synthetic sound SC.

Furthermore, in another modification in which the vehicle 2 has both an internal combustion engine and an electric motor, the number of revolutions of one or both of the electric motor and the internal combustion engine can be used to determine the frequency and the sound pressure of the synthetic sound SC.

In accordance with the present application, a travel situation estimation circuitry estimates at least one of the first travel situation in which the driver accelerates or decelerates the vehicle gently and the second travel situation in which the driver accelerates or decelerates the vehicle more quickly than in the first travel situation and the sound control circuitry changes the magnitudes of the sound pressures to be applied to the plurality of frequencies that form the synthetic sound between the case in which the first travel situation or the second travel situation is estimated and the case in which neither the first travel situation nor the second travel situation is estimated (for example, the vehicle travels at a substantially constant speed). This enables the driver to hear a sound useful for perception depending on the travel situation. As a result, the driver grasps the state (such as the number of revolutions) of the rotary power source and the operational state (such as the vehicle speed) of the vehicle based on a sound from the vehicle sound generation device and can perform a correct accelerator operation suitable for the travel situation of the vehicle.

It is assumed that the first travel situation described above in which the driver accelerates or decelerates the vehicle gently includes the situation in which the vehicle is actually accelerating or decelerating, the situation in which the vehicle accelerates or decelerates gently hereafter, and the situation in which the driver intends to accelerate or decelerate the vehicle gently. Similarly, it is assumed that the second travel situation in which the driver accelerates or decelerates the vehicle quickly includes the situation in which the vehicle is actually accelerating or decelerating quickly, the situation in which the vehicle will accelerate or decelerate quickly hereafter, and the situation in which the driver intends to accelerate or decelerate the vehicle quickly. In one example, the first travel situation corresponds to the situation in which the change amount of the accelerator opening per a predetermined time by the driver falls within a predetermined range and the second travel situation corresponds to the situation in which the change amount of the accelerator opening per the predetermined time by the driver is equal to or more than a predetermined value (equal to or more than the upper limit of the predetermined range).

The sound control circuitry makes a ratio of a sound pressure of a sound in a high frequency band within a frequency range of the synthetic sound to a sound pressure of the synthetic sound in the case in which the travel situation estimation circuitry estimates the first travel situation larger than in the case in which the travel situation estimation circuitry estimates neither the first travel situation nor the second travel situation.

Thus, it is possible to cause the driver to hear a high frequency sound to which human auditory perception is highly sensitive in the first travel situation. As a result, the driver can easily recognize a slight change in the state of the rotary power source and the operational state of the vehicle through a change in the pitch of the sound from the vehicle sound generation device, thereby enabling a more correct accelerator operation.

In accordance with the present disclosure, the sound control circuitry makes the sound pressure of the synthetic sound identical between the case in which the travel situation estimation circuitry estimates the first travel situation and the case in which the travel situation estimation circuitry estimates neither the first travel situation nor the second travel situation.

According to the present disclosure configured as described above, it is possible to suppress the harshness due to a high frequency sound in the first travel situation and the discomfort due to a change in the sound pressure of the synthetic sound when the first travel situation is switched to another travel situation (for example, a travel situation in which the vehicle travels at a substantially constant speed).

In accordance with the present disclosure, the sound control circuitry makes the sound pressure of the synthetic sound in the case in which the travel situation estimation circuitry estimates the second travel situation higher than in the case in which the travel situation estimation circuitry estimates neither the first travel situation nor the second travel situation.

According to the present disclosure, it is possible to cause the driver to feel the strength of acceleration through the sound pressure in the second travel situation.

In accordance with the present disclosure, in a low revolutions range in which the number of revolutions is less than a predetermined value, the sound control circuitry makes a ratio of a sound pressure of a sound in a low frequency band within the frequency range of the synthetic sound to the sound pressure of the synthetic sound in the case in which the travel situation estimation circuitry estimates the second travel situation larger than in the case in which the travel situation estimation circuitry estimates neither the first travel situation nor the second travel situation.

According to the present disclosure configured as described above, it is possible to cause the driver to feel the strength of acceleration through a low frequency sound in the second travel situation.

In accordance with the present disclosure, in a high revolutions range in which the number of revolutions is equal to or more than the predetermined value, the sound control circuitry makes the ratio of the sound pressure of the sound in the high frequency band within the frequency range of the synthetic sound to the sound pressure of the synthetic sound in the case in which the travel situation estimation circuitry estimates the second travel situation larger than in the case in which the travel situation estimation circuitry estimates neither the first travel situation nor the second travel situation.

According to the present disclosure configured as described above, it is possible to prompt, for example, a shift change by the driver by increasing the harshness due to a high frequency sound in the high revolutions range in the second travel situation.

In accordance with the present disclosure, the travel situation estimation circuitry obtains a position of the vehicle and estimates at least one of the first travel situation and the second travel situation based on a change in the obtained position. According to the present disclosure configured as described above, the geometry (such as, for example, a winding road or a road with many ups and downs) of this travel road is determined based on changes in the position of the vehicle and the travel situation according to this geometry of the travel road can be appropriately estimated.

In the present disclosure, the travel situation estimation circuitry obtains road information around the vehicle and estimates at least one of the first travel situation and the second travel situation based on the obtained road information.

According to the present disclosure configured as described above, the travel situation according to the geometry of the travel road can be appropriately estimated by determining the geometry of the travel road based on various types of information (such as, for example, the road type, and the altitude and curvature of the road) included in the road information.

In accordance with the present disclosure, the travel situation estimation circuitry obtains an accelerator opening corresponding to an operation amount of an accelerator pedal of the vehicle and estimates at least one of the first travel situation and the second travel situation based on a change in the obtained accelerator opening.

According to the present disclosure configured as described above, the travel situation according to an accelerator operation by the driver can be appropriately estimated.

The vehicle sound generation device according to the present disclosure can output a sound that enables the driver to perform a correct accelerator operation suitable for the travel situation of the vehicle.

DESCRIPTION OF REFERENCE SIGNS AND NUMERALS

1: vehicle sound generation device
2: vehicle
3: electric motor
10: sound control device
12: sound control unit
13: travel situation estimation unit
14: storage unit
20: speaker (sound output unit)
30: sensor group
31: motor revolutions sensor
32: motor torque sensor
33: vehicle speed sensor
34: accelerator position sensor
35: positioning device
36: navigation device
M1: first sound pressure map
M2: second sound pressure map
M3: third sound pressure map

The invention claimed is:

1. A vehicle sound generation device mounted in a vehicle, the vehicle including a rotary power source which propels the vehicle, the vehicle sound generation device comprising:
   a sound control circuit configured to
      set a plurality of frequencies according to a number of revolutions of the rotary power source and sound pressures to be applied to the plurality of frequencies, and
      generate a synthetic sound signal representing a synthetic sound including sounds of the plurality of frequencies to which the set sound pressures have been applied;
   a travel situation estimation circuit configured to
      estimate a first travel situation in which a driver of the vehicle accelerates or decelerates the vehicle at a first rate, and
      estimate a second travel situation in which the driver accelerates or decelerates the vehicle at a second rate greater than the first rate; and
   a speaker to output the synthetic sound based on the synthetic sound signal generated by the sound control circuit, wherein
   the sound control circuit is further configured to
      change magnitudes of the sound pressures applied to the plurality of frequencies between a first case in which the travel situation estimation circuit estimates the first travel situation or the second travel situation and a second case in which the travel situation estimation circuit estimates that the driver drives the vehicle at a constant speed,
      calculate a first ratio of a sound pressure of a sound, in a first frequency band within a frequency range of the synthetic sound, to a sound pressure of the synthetic sound when the travel situation estimation circuit estimates the first travel situation, and
      calculate a second ratio of a sound pressure of a sound, in a first frequency band within a frequency range of the synthetic sound, to a sound pressure of the synthetic sound when the travel situation estimation circuit estimates neither the first travel situation nor the second travel situation, the first ratio being larger than the second ratio in a first revolutions band.

2. The vehicle sound generation device according to claim 1, wherein the first ratio being larger than the second ratio is noticeable in the first revolutions band.

3. The vehicle sound generation device according to claim 2, wherein the sound control circuit calculates the sound pressure of the synthetic sound as being identical when the travel situation estimation circuit estimates the first travel situation and when the travel situation estimation circuit estimates neither the first travel situation nor the second travel situation.

4. The vehicle sound generation device according to claim 3, wherein the sound control circuit calculates the sound pressure of the synthetic sound as being higher when the travel situation estimation circuit estimates the second travel situation than when the travel situation estimation circuit estimates neither the first travel situation nor the second travel situation.

5. The vehicle sound generation device according to claim 4, wherein in a second revolutions range in which the number of revolutions is less than a predetermined value, the sound control circuit changes the magnitudes of the sound pressures so that a first ratio is larger than a second ratio, the first ratio is a ratio of a sound pressure of a sound, in a second frequency band within the frequency range of the synthetic sound, to the sound pressure of the synthetic sound when the travel situation estimation circuit estimates the second travel situation, and the second ratio is a ratio of a sound pressure of a sound, and in a second frequency band within the frequency range of the synthetic sound, to the sound pressure of the synthetic sound when the travel situation estimation circuit estimates neither the first travel situation nor the second travel situation.

6. The vehicle sound generation device according to claim 5, wherein
   in a first revolutions range in which the number of revolutions is equal to or more than the predetermined value, the sound control circuit changes the magnitudes of the sound pressures so that a third ratio is larger than a fourth ratio,
   the third ratio is a ratio of the sound pressure of the sound in the first frequency band within the frequency range of the synthetic sound to the sound pressure of the synthetic sound when the travel situation estimation circuit estimates the second travel situation, and
   the fourth ratio is a ratio of the sound pressure of the sound in the first frequency band within the frequency range of the synthetic sound to the sound pressure of the synthetic sound when the travel situation estimation circuit estimates neither the first travel situation nor the second travel situation.

7. The vehicle sound generation device according to claim 6, wherein the travel situation estimation circuit is further configured to
   repeatedly obtain a position of the vehicle, and
   estimate at least one of the first travel situation and the second travel situation based on a change in the obtained position.

8. The vehicle sound generation device according to claim 7, wherein the travel situation estimation circuit is further configured to obtain road information around the vehicle and estimate at least one of the first travel situation and the second travel situation based on the obtained position and the obtained road information.

9. The vehicle sound generation device according to claim 8, wherein the travel situation estimation circuit is further configured to obtain an accelerator opening corresponding to an operation amount of an accelerator pedal of the vehicle and estimate at least one of the first travel situation and the second travel situation based on a change in the obtained accelerator opening, the obtained position and the obtained road information.

10. The vehicle sound generation device according to claim 1, wherein the sound control circuit calculates the sound pressure of the synthetic sound as being higher when the travel situation estimation circuit estimates the second travel situation than when the travel situation estimation circuit estimates neither the first travel situation nor the second travel situation.

11. The vehicle sound generation device according to claim 1, wherein in a second revolutions range in which the number of revolutions is less than a predetermined value, the sound control circuit changes the magnitudes of the sound pressures so that a first ratio is larger than a second ratio,
   the first ratio is a ratio of the sound pressure of the sound in the first frequency band within the frequency range of the synthetic sound to the sound pressure of the synthetic sound when the travel situation estimation circuit estimates the second travel situation, and
   the second ratio is a ratio of the sound pressure of the sound in the first frequency band within the frequency range of the synthetic sound to the sound pressure of the synthetic sound when the travel situation estimation circuit estimates neither the first travel situation nor the second travel situation.

12. The vehicle sound generation device according to claim 1, wherein in a first revolutions range in which the number of revolutions is equal to or more than the predetermined value, the sound control circuit changes the magnitudes of the sound pressures so that a first ratio is larger than a second ratio,
   the first ratio is a ratio of the sound pressure of the sound in the first frequency band within the frequency range of the synthetic sound to the sound pressure of the synthetic sound when the travel situation estimation circuit estimates the second travel situation, and
   the second ratio is a ratio of the sound pressure of the sound in the first frequency band within the frequency range of the synthetic sound to the sound pressure of the synthetic sound when the travel situation estimation circuit estimates neither the first travel situation nor the second travel situation.

13. The vehicle sound generation device according to claim 1, wherein the travel situation estimation circuit is further configured to
   repeatedly obtain a position of the vehicle, and
   estimate at least one of the first travel situation and the second travel situation based on a change in the obtained position.

14. The vehicle sound generation device according to claim 1, wherein the travel situation estimation circuit is further configured to obtain an accelerator opening corresponding to an operation amount of an accelerator pedal of the vehicle and estimate at least one of the first travel situation and the second travel situation based on a change in the obtained accelerator opening.

15. The vehicle sound generation device according to claim 1, further comprising:
   a speaker including an amplifier, the speaker configured to
      output the synthetic sounds,
      receive the synthetic sound signal from the sound control circuit,
      amplify the synthetic sound signal with a predetermined amplification factor, and then
      output the synthetic sound based on the amplified synthetic sound signal.

16. The vehicle sound generation device according to claim 1, further comprising:
   a memory that stores sound pressure maps, wherein
   the sound control circuit is configured to control an input and output of data, including the sound pressure maps, to the memory.

17. The vehicle sound generation device according to claim 1, wherein the first ratio being larger than the second ratio is only noticeable in the first revolutions band.

18. A vehicle sound generation device mounted in a vehicle, the vehicle including a rotary power source which propels the vehicle, the vehicle sound generation device comprising:

a sound control circuit configured to
  set a plurality of frequencies according to a number of revolutions of the rotary power source and sound pressures to be applied to the plurality of frequencies, and
  generate a synthetic sound signal representing a synthetic sound including sounds of the plurality of frequencies to which the set sound pressures have been applied;
a travel situation estimation circuit configured to
  estimate a first travel situation in which a driver of the vehicle accelerates or decelerates the vehicle at a first rate, and
  estimate a second travel situation in which the driver accelerates or decelerates the vehicle at a second rate greater than the first rate; and
a speaker to output the synthetic sound based on the synthetic sound signal generated by the sound control circuit, wherein
the sound control circuit is further configured to change magnitudes of the sound pressures applied to the plurality of frequencies between a first case in which the travel situation estimation circuit estimates the first travel situation or the second travel situation and a second case in which the travel situation estimation circuit estimates that the driver drives the vehicle at a constant speed,
in a second revolutions range in which the number of revolutions is less than a predetermined value, the sound control circuit changes the magnitudes of the sound pressures so that a first ratio is larger than a second ratio,
the first ratio is a ratio of a sound pressure of a sound, in a second frequency band within the frequency range of the synthetic sound, to the sound pressure of the synthetic sound when the travel situation estimation circuit estimates the second travel situation,
the second ratio is a ratio of a sound pressure of a sound, in a second frequency band within the frequency range of the synthetic sound, to the sound pressure of the synthetic sound when the travel situation estimation circuit estimates neither the first travel situation nor the second travel situation,
in a first revolutions range in which the number of revolutions is equal to or more than the predetermined value, the sound control circuit changes the magnitudes of the sound pressures so that a third ratio is larger than a fourth ratio,
the third ratio is a ratio of the sound pressure of the sound in the first frequency band within the frequency range of the synthetic sound to the sound pressure of the synthetic sound when the travel situation estimation circuit estimates the second travel situation, and
the fourth ratio is a ratio of the sound pressure of the sound in the first frequency band within the frequency range of the synthetic sound to the sound pressure of the synthetic sound when the travel situation estimation circuit estimates neither the first travel situation nor the second travel situation.

19. The vehicle sound generation device according to claim 18, wherein the sound control circuit calculates the sound pressure of the synthetic sound when the travel situation estimation circuit estimates the second travel situation as being larger than the sound pressure of the synthetic sound when the travel situation estimation circuit estimates neither the first travel situation nor the second travel situation.

* * * * *